US009887683B2

(12) United States Patent
Kuribara et al.

(10) Patent No.: US 9,887,683 B2
(45) Date of Patent: Feb. 6, 2018

(54) BALANCE-UNBALANCE CONVERTER (71) Applicant: Murata Manufacturing Co., Ltd., Nagaokakyo-shi, Kyoto-fu (JP)

(72) Inventors: Atsushi Kuribara, Nagaokakyo (JP); Yosuke Matsushita, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 24 days.

(21) Appl. No.: 15/212,474

(22) Filed: Jul. 18, 2016

(65) Prior Publication Data
US 2017/0026024 A1 Jan. 26, 2017

(30) Foreign Application Priority Data
Jul. 24, 2015 (JP) ................. 2015-146467

(51) Int. Cl.
*H03H 7/42* (2006.01)
*H03H 7/01* (2006.01)
*H01P 5/10* (2006.01)
*H03H 1/00* (2006.01)

(52) U.S. Cl.
CPC ....... *H03H 7/42* (2013.01); *H03H 2001/0085* (2013.01)

(58) Field of Classification Search
CPC .... H03H 7/42; H03H 7/01; H01P 3/08; H01P 5/10
USPC .................................................. 333/25, 26
See application file for complete search history.

(56) References Cited

U.S. PATENT DOCUMENTS

| 5,949,299 A * | 9/1999 | Harada ..................... H03H 7/42 333/185 |
| 7,005,956 B2 * | 2/2006 | Wang ....................... H03H 7/42 333/25 |
| 7,116,185 B2 * | 10/2006 | Ohi ......................... H03H 7/42 333/100 |
| 7,330,085 B2 * | 2/2008 | Ezzeddine ............... H03H 7/42 333/25 |
| 7,978,021 B2 * | 7/2011 | Tamaru .................... H03H 7/42 333/246 |
| 9,035,717 B2 * | 5/2015 | Tanaka .................... H03H 7/42 333/109 |
| 9,059,681 B2 * | 6/2015 | Tanaka .................... H03H 7/42 |
| 2013/0154768 A1 | 6/2013 | Taniguchi |
| 2014/0043108 A1 | 2/2014 | Tanaka |

FOREIGN PATENT DOCUMENTS

| JP | 2000-059168 A | 2/2000 |
| JP | 2012-205195 A | 10/2012 |
| TW | 201322626 A1 | 6/2013 |
| TW | 201414195 A | 4/2014 |

* cited by examiner

Primary Examiner — Dean Takaoka
(74) Attorney, Agent, or Firm — Keating & Bennett, LLP (57) ABSTRACT A balance-unbalance converter includes a low pass filter including a first inductor and a first capacitor and a high pass filter including a second inductor and a second capacitor. A via continuous portion of the first inductor penetrates a helix of a helical portion of the second inductor, and a via continuous portion of the second inductor penetrates a helix of a helical portion of the first inductor.

15 Claims, 7 Drawing Sheets

BALANCE-UNBALANCE CONVERTER

CROSS REFERENCE TO RELATED APPLICATIONS

This application claims the benefit of priority to Japanese Patent Application 2015-146467 filed Jul. 24, 2015, the entire contents of which are hereby incorporated by reference.

BACKGROUND OF THE INVENTION

1. Field of the Invention

The present invention relates to a laminated balance-unbalance converter including a multilayer body, and more specifically relates to a balance-unbalance converter including a low pass filter and a high pass filter within a multilayer body, and is small-sized and in which inductance values of an inductor of the low pass filter and an inductor of the high pass filter are relatively high and magnetic coupling between the inductor of the low pass filter and the inductor of the high pass filter is significantly reduced or prevented.

2. Description of the Related Art

Japanese Unexamined Patent Application Publication No. 2012-205195 discloses a laminated balance-unbalance converter (laminated balun) in which a low pass filter and a high pass filter are formed within a multilayer body in which a plurality of insulating layers are laminated.

In the balance-unbalance converter disclosed in Japanese Unexamined Patent Application Publication No. 2012-205195, the low pass filter includes an inductor and a capacitor and is connected between an unbalanced terminal and a first balanced terminal. In addition, the high pass filter includes an inductor and a capacitor and is connected between the unbalanced terminal and a second balanced terminal.

The balance-unbalance converter disclosed in Japanese Unexamined Patent Application Publication No. 2012-205195 is used at a high frequency such as the 2.4 GHz band, as is seen from a characteristics diagram or the like. Although a frequency being high or low is relative, for example, the 2.4 GHz band is referred to as high frequencies and the 700 MHz band is referred to as low frequencies in the present specification.

It is possible to design the balance-unbalance converter used at a high frequency, such that the inductance values of the inductor of the low pass filter and the inductor of the high pass filter are relatively low.

Meanwhile, from manufactures and sellers of electronic devices in which a balance-unbalance converter is used, there is a large demand also for a balance-unbalance converter used at a low frequency such as the 700 MHz band.

In order to obtain desired characteristics, a balance-unbalance converter used at a low frequency needs to be designed such that the inductance values of the inductor of the low pass filter and the inductor of the high pass filter are relatively high.

In the balance-unbalance converter, in order to make the inductance values of the inductors of the low pass filter and the high pass filter high, for example, it is necessary to increase the length of each inductor. In order to increase the length of each inductor, it is necessary to increase the number of the insulating layers of the multilayer body, increase the planar size of the multilayer body, or achieve both.

However, increasing the number of the insulating layers of the multilayer body to increase the height of the multilayer body or increasing the planar size of the multilayer body is contrary to the demand to reduce the size and the weight of an electronic component.

SUMMARY OF THE INVENTION

Preferred embodiments of the present invention provide a balance-unbalance converter including a multilayer body in which a plurality of insulating layers are laminated; an unbalanced terminal, a first balanced terminal, and a second balanced terminal on a surface of the multilayer body; a capacitor electrode between predetermined layers of the multilayer body; a line electrode between predetermined layers of the multilayer body; a via electrode that penetrates between both principal surfaces of a predetermined one of the insulating layers; a low pass filter connected between the unbalanced terminal and the first balanced terminal and including a first inductor and a first capacitor; and a high pass filter connected between the unbalanced terminal and the second balanced terminal and including a second inductor and a second capacitor, wherein the first inductor of the low pass filter has a structure such that a helical portion in which the via electrode and the line electrode are alternately connected and a via continuous portion in which a plurality of the via electrodes are connected to each other, the first capacitor of the low pass filter includes a plurality of the opposing capacitor electrodes, the second inductor of the high pass filter has a structure such that a helical portion in which the via electrode and the line electrode are alternately connected and a via continuous portion in which a plurality of the via electrodes are connected to each other, the second capacitor of the high pass filter includes a plurality of the opposing capacitor electrodes, the via continuous portion of the first inductor penetrates a helix of the helical portion of the second inductor, and the via continuous portion of the second inductor penetrates a helix of the helical portion of the first inductor.

Preferably, the via continuous portion of the first inductor penetrates a center or an approximate center within the helix of the helical portion of the second inductor, and the via continuous portion of the second inductor penetrates a center or an approximate center within the helix of the helical portion of the first inductor. In this case, each of the distance between the via continuous portion of the first inductor and the helical portion of the second inductor and the distance between the via continuous portion of the second inductor and the helical portion of the first inductor is uniform and maximum, so that it is possible to most effectively reduce or prevent magnetic coupling between the first inductor and the second inductor, and it is possible to improve the characteristics of the balance-unbalance converter.

Preferably, in the multilayer body, the first capacitor of the low pass filter and the second capacitor of the high pass filter are disposed between the first inductor of the low pass filter and the second inductor of the high pass filter; and the first balanced terminal and the second balanced terminal. In this case, by the capacitor electrode of the first capacitor of the low pass filter and the capacitor electrode of the second capacitor of the high pass filter, it is possible to reduce or prevent magnetic coupling between the first inductor of the low pass filter and the second inductor of the high pass filter and the first balanced terminal and the second balanced terminal, and it is possible to improve the characteristics of the balance-unbalance converter.

In this case, preferably, in the multilayer body, the first inductor of the low pass filter and the second capacitor of the high pass filter are disposed adjacently in a lamination direction in which the insulating layers are laminated, and the second inductor of the high pass filter and the first capacitor of the low pass filter are disposed adjacently in the lamination direction in which the insulating layers are laminated. In this case, it is possible to very reasonably dispose the first inductor of the first capacitor of the low pass filter and the second inductor and the second capacitor of the high pass filter within the multilayer body, so that a wasted routing wire and addition of an insulating layer for routing the wire are not necessary. Since the wasted routing wire is not necessary, the characteristics of the balance-unbalance converter do not deteriorate due to the routing wire. In addition, since the wasted routing wire and addition of an insulating layer for routing the wire are not necessary, the size of the balance-unbalance converter is not increased by the routing wire and the additional insulating layer.

In the balance-unbalance converter according to a preferred embodiment of the present invention, since the via continuous portion of the first inductor penetrates the helix of the helical portion of the second inductor and the via continuous portion of the second inductor penetrates the helix of the helical portion of the first inductor, it is possible to lengthen the first inductor and the second inductor, without increasing the size of the multilayer body, to increase the inductance value of each of the first inductor and the second inductor.

In addition, in the balance-unbalance converter according to a preferred embodiment of the present invention, since the via continuous portion of the first inductor penetrates the helix of the helical portion of the second inductor and the via continuous portion of the second inductor penetrates the helix of the helical portion of the first inductor, magnetic coupling between the first inductor and the second inductor is significantly reduced or prevented, so that deterioration of characteristics caused due to magnetic coupling between the first inductor and the second inductor is significantly reduced or prevented.

The above and other elements, features, steps, characteristics and advantages of the present invention will become more apparent from the following detailed description of the preferred embodiments with reference to the attached drawings.

DESCRIPTION OF THE PREFERRED EMBODIMENTS

Hereinafter, preferred embodiments of the present invention will be described with reference to the drawings.

The preferred embodiments of the present invention are illustratively shown, and the present invention is not limited to the contents of the preferred embodiments. In addition, the drawings are intended to facilitate understanding of the preferred embodiments, and may not be necessarily precisely depicted. For example, the ratio of the dimensions of depicted components may not agree with the ratio of the dimensions of these components described in the specification. Moreover, a component described in the specification may be omitted in the drawings, and components may be depicted such that the number of the components is reduced.

Figure 1:
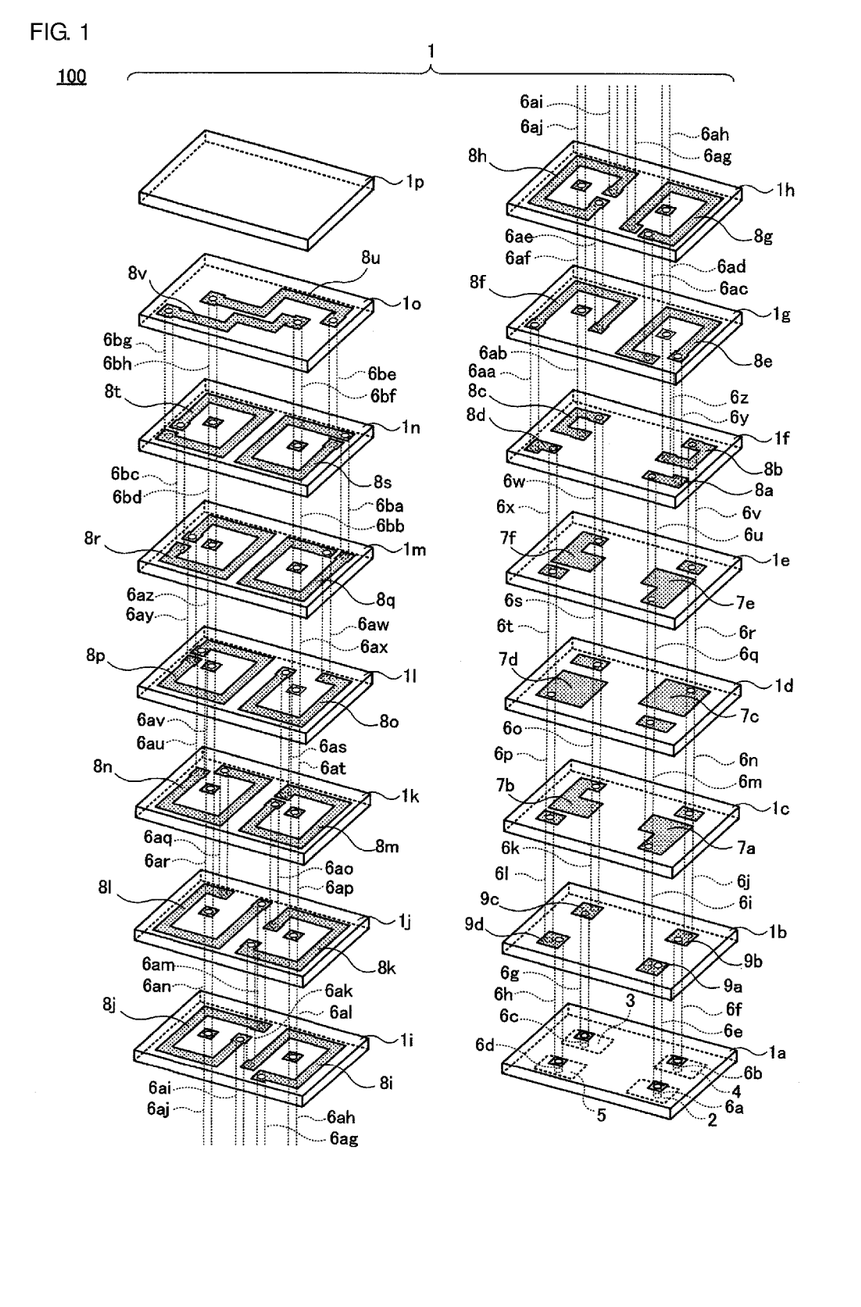
FIG. 1 is an exploded perspective view of a balance-unbalance converter according to a preferred embodiment of the present invention

FIG. 1 shows a balance-unbalance converter 100 according to a preferred embodiment of the present invention. FIG. 1 is an exploded perspective view of the balance-unbalance converter 100.

As shown in FIG. 1, the balance-unbalance converter 100 includes a multilayer body 1 in which, for example, 16 insulating layers 1a to 1p are laminated. The multilayer body 1 preferably has a rectangular or a substantially rectangular parallelepiped shape. For example, a ceramic material is used as the material of the multilayer body 1 (the insulating layers 1a to 1p).

An unbalanced terminal (input terminal) 2, a first balanced terminal (output terminal) 3, a second balanced terminal (output terminal) 4, and a ground terminal 5 are provided on the lower principal surface of the multilayer body 1 (insulating layer 1a). Each of the unbalanced terminal 2, the first balanced terminal 3, the second balanced terminal 4, and the ground terminal 5 is preferably made of metal containing Ag, Cu, an alloy thereof, or the like as a principal component, and a plating layer containing Ni, Sn, Au, or the like as a principal component is provided on the surface over one or a plurality of layers as necessary.

Hereinafter, the insulating layers 1a to 1p, via electrodes 6a to 6bh that penetrate between the principal surfaces of the insulating layers 1a to 1p, capacitor electrodes 7a to 7f and line electrodes 8a to 8v provided on the principal surfaces of the insulating layers 1a to 1p, etc., will be described.

Auxiliary electrodes may be provided at end portions of the via electrodes 6a to 6bh and on the principal surfaces of the insulating layers 1a to 1p in order to ensure electrical connections between the via electrodes 6a to 6bh, but impartation of reference numerals thereto may be omitted or the description thereof may be omitted, for avoiding the description being complicated.

As described above, the unbalanced terminal 2, the first balanced terminal 3, the second balanced terminal 4, and the ground terminal 5 are provided on the lower principal surface of the insulating layer 1a.

The four via electrodes 6a, 6b, 6c, and 6d penetrate between both principal surfaces of the insulating layer 1a. The via electrode 6a, the via electrode 6b, the via electrode 6c, and the via electrode 6d are connected (electrically connected) to the unbalanced terminal 2, the second balanced terminal 4, the first balanced terminal 3, and the ground terminal 5, respectively.

The four via electrodes 6e, 6f, 6g, and 6h penetrate between both principal surfaces of the insulating layer 1b. The via electrode 6e, the via electrode 6f, the via electrode 6g, and the via electrode 6h are connected to the via electrode 6a, the via electrode 6b, the via electrode 6c, and the via electrode 6d, respectively.

Four connection electrodes 9a, 9b, 9c, and 9d are provided on the upper principal surface of the insulating layer 1b. The connection electrode 9a, the connection electrode 9b, the connection electrode 9c, and the connection electrode 9d are connected to the via electrode 6e, the via electrode 6f, the via electrode 6g, and the via electrode 6h, respectively.

The four via electrodes 6i, 6j, 6k, and 6l penetrate between both principal surfaces of the insulating layer 1c. The via electrode 6i, the via electrode 6j, the via electrode 6k, and the via electrode 6l are connected to the connection electrode 9a, the connection electrode 9b, the connection electrode 9c, and the connection electrode 9d, respectively.

The two capacitor electrodes 7a and 7b are provided on the upper principal surface of the insulating layer 1c. The capacitor electrode 7a and the capacitor electrode 7b are connected to the via electrode 6i and the via electrode 6k, respectively.

The four via electrodes 6m, 6n, 6o, and 6p penetrate between both principal surfaces of the insulating layer 1d. The via electrode 6m, the via electrode 6n, the via electrode 6o, and the via electrode 6p are connected to the capacitor electrode 7a, the via electrode 6j, the capacitor electrode 7b, and the via electrode 6l, respectively.

The two capacitor electrodes 7c and 7d are provided on the upper principal surface of the insulating layer 1d. The capacitor electrode 7c and the capacitor electrode 7d are connected to the via electrode 6n and the via electrode 6p, respectively.

The four via electrodes 6q, 6r, 6s, and 6t penetrate between both principal surfaces of the insulating layer 1e. The via electrode 6q, the via electrode 6r, the via electrode 6s, and the via electrode 6t are connected to the via electrode 6m, the capacitor electrode 7c, the via electrode 6o, and the capacitor electrode 7d, respectively.

The two capacitor electrodes 7e and 7f are provided on the upper principal surface of the insulating layer 1e. The capacitor electrode 7e and the capacitor electrode 7f are connected to the via electrode 6q and the via electrode 6s, respectively.

The four via electrodes 6u, 6v, 6w, and 6x penetrate between both principal surfaces of the insulating layer 1f. The via electrode 6u, the via electrode 6v, the via electrode 6w, and the via electrode 6x are connected to the capacitor electrode 7e, the via electrode 6r, the capacitor electrode 7f, and the via electrode 6t, respectively.

The four line electrodes 8a, 8b, 8c, and 8d are provided on the upper principal surface of the insulating layer 1f. One end of the line electrode 8a, one end of the line electrode 8b, one end of the line electrode 8c, and one end of the line electrode 8d are connected to the via electrode 6u, the via electrode 6v, the via electrode 6w, and the via electrode 6x, respectively.

The four via electrodes 6y, 6z, 6aa, and 6ab penetrate between both principal surfaces of the insulating layer 1g. The via electrode 6y, the via electrode 6z, the via electrode 6aa, and the via electrode 6ab are connected to the other end of the line electrode 8a, the other end of the line electrode 8b, the other end of the line electrode 8d, and the other end of the line electrode 8c, respectively.

The two substantially annular line electrodes 8e and 8f are provided on the upper principal surface of the insulating layer 1g. One end of the line electrode 8e and one end of the line electrode 8f are connected to the via electrode 6y and the via electrode 6aa, respectively.

In the insulating layer 1g, the via electrode 6z and the via electrode 6ab are located at or substantially at the center of the substantially annular line electrode 8e and at or substantially at the center of the substantially annular line electrode 8f, respectively.

The four via electrodes 6ac, 6ad, 6ae, and 6af penetrate between both principal surfaces of the insulating layer 1h. The via electrode 6ac, the via electrode 6ad, the via electrode 6ae, and the via electrode 6af are connected to the other end of the line electrode 8e, the via electrode 6z, the other end of the line electrode 8f, and the via electrode 6ab, respectively.

The two substantially annular line electrodes 8g and 8h are provided on the upper principal surface of the insulating layer 1h. One end of the line electrode 8g and one end of the line electrode 8h are connected to the via electrode 6ac and the via electrode 6ae, respectively.

In the insulating layer 1h, the via electrode 6ad and the via electrode 6af are located at or substantially at the center of the substantially annular line electrode 8g and at or substantially at the center of the substantially annular line electrode 8h, respectively.

The four via electrodes 6ag, 6ah, 6ai, and 6aj penetrate between both principal surfaces of the insulating layer 1i. The via electrode 6ag, the via electrode 6ah, the via electrode 6ai, and the via electrode 6aj are connected to the other end of the line electrode 8g, the via electrode 6ad, the other end of the line electrode 8h, and the via electrode 6af, respectively.

The two substantially annular line electrodes 8i and 8j are provided on the upper principal surface of the insulating layer 1i. One end of the line electrode 8i and one end of the line electrode 8j are connected to the via electrode 6ag and the via electrode 6ai, respectively.

In the insulating layer 1i, the via electrode 6ah and the via electrode 6aj are located at or substantially at the center of the substantially annular line electrode 8i and at or substantially at the center of the substantially annular line electrode 8j, respectively.

The four via electrodes 6ak, 6al, 6am, and 6an penetrate between both principal surfaces of the insulating layer 1j. The via electrode 6ak, the via electrode 6al, the via electrode 6am, and the via electrode 6an are connected to the other end of the line electrode 8i, the via electrode 6ah, the other end of the line electrode 8j, and the via electrode 6aj, respectively.

The two substantially annular line electrodes 8k and 8l are provided on the upper principal surface of the insulating layer 1j. One end of the line electrode 8k and one end of the line electrode 8l are connected to the via electrode 6ak and the via electrode 6am, respectively.

In the insulating layer 1j, the via electrode 6al and the via electrode 6an are located at or substantially at the center of the substantially annular line electrode 8k and at or substantially at the center of the substantially annular line electrode 8l, respectively.

The four via electrodes 6ao, 6ap, 6aq, and 6ar penetrate between both principal surfaces of the insulating layer 1k. The via electrode 6ao, the via electrode 6ap, the via electrode 6aq, and the via electrode 6ar are connected to the other end of the line electrode 8k, the via electrode 6al, the other end of the line electrode 8l, and the via electrode 6an, respectively.

The two substantially annular line electrodes 8m and 8n are provided on the upper principal surface of the insulating layer 1k. One end of the line electrode 8m and one end of the line electrode 8n are connected to the via electrode 6ao and the via electrode 6aq, respectively.

In the insulating layer 1k, the via electrode 6aq and the via electrode 6ar are located at or substantially at the center of the substantially annular line electrode 8m and at or substantially at the center of the substantially annular line electrode 8n, respectively.

The four via electrodes 6as, 6at, 6au, and 6av penetrate between both principal surfaces of the insulating layer 1l. The via electrode 6as, the via electrode 6at, the via electrode 6au, and the via electrode 6av are connected to the other end of the line electrode 8m, the via electrode 6ap, the other end of the line electrode 8n, and the via electrode 6ar, respectively.

The two substantially annular line electrodes 8o and 8p are provided on the upper principal surface of the insulating layer 1l. One end of the line electrode 8o and one end of the line electrode 8p are connected to the via electrode 6as and the via electrode 6au, respectively.

In the insulating layer 1l, the via electrode 6at and the via electrode 6av are located at or substantially at the center of the substantially annular line electrode 8o and at or substantially at the center of the substantially annular line electrode 8p, respectively.

The four via electrodes 6aw, 6ax, 6ay, and 6az penetrate between both principal surfaces of the insulating layer 1m. The via electrode 6aw, the via electrode 6ax, the via electrode 6ay, and the via electrode 6az are connected to the other end of the line electrode 8o, the via electrode 6at, the other end of the line electrode 8p, and the via electrode 6av, respectively.

The two substantially annular line electrodes 8q and 8r are provided on the upper principal surface of the insulating layer 1m. One end of the line electrode 8q and one end of the line electrode 8r are connected to the via electrode 6aw and the via electrode 6ay, respectively.

In the insulating layer 1m, the via electrode 6ax and the via electrode 6az are located at or substantially at the center of the substantially annular line electrode 8q and at or substantially at the center of the substantially annular line electrode 8r, respectively.

The four via electrodes 6ba, 6bb, 6bc, and 6bd penetrate between both principal surfaces of the insulating layer 1n. The via electrode 6ba, the via electrode 6bb, the via electrode 6bc, and the via electrode 6bd are connected to the other end of the line electrode 8q, the via electrode 6ax, the other end of the line electrode 8r, and the via electrode 6az, respectively.

The two substantially annular line electrodes 8s and 8t are provided on the upper principal surface of the insulating layer 1n. One end of the line electrode 8s and one end of the line electrode 8t are connected to the via electrode 6ba and the via electrode 6bc, respectively.

In the insulating layer 1n, the via electrode 6bb and the via electrode 6bd are located at or substantially at the center of the substantially annular line electrode 8s and at or substantially at the center of the substantially annular line electrode 8t, respectively.

The four via electrodes 6be, 6bf, 6bg, and 6bh penetrate between both principal surfaces of the insulating layer 1o. The via electrode 6be, the via electrode 6bf, the via electrode 6bg, and the via electrode 6bn are connected to the other end of the line electrode 8s, the via electrode 6bb, the other end of the line electrode 8t, and the via electrode 6bd, respectively.

The two line electrodes 8u and 8v are provided on the upper principal surface of the insulating layer 1o. One end of the line electrode 8u and the other end of the line electrode 8u are connected to the via electrode 6be and the via electrode 6bh, respectively. One end of the line electrode 8v and the other end of the line electrode 8v are connected to the via electrode 6bf and the via electrode 6bg, respectively.

The insulating layer 1p is a protective layer, and no electrode is provided thereon.

The balance-unbalance converter 100 according to the present preferred embodiment of the present invention having the structure described above may be manufactured by a general manufacturing method that is used hitherto for manufacturing a balance-unbalance converter including a multilayer body in which insulating layers are laminated.

Figure 2:
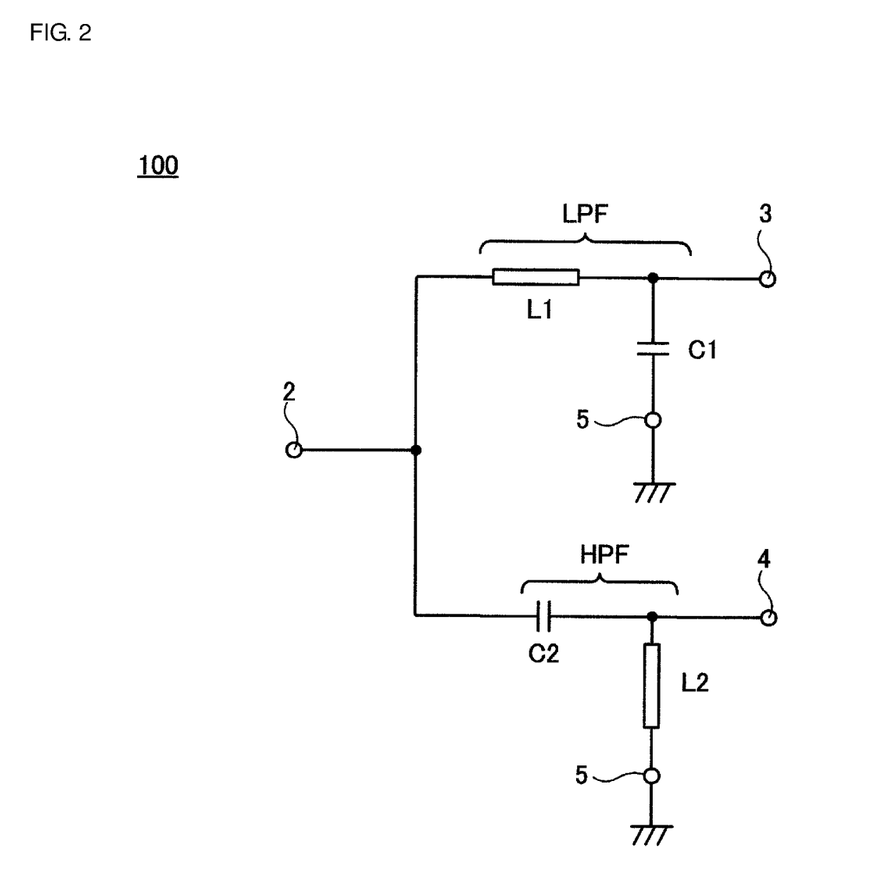
FIG. 2 is an equivalent circuit diagram of the balance-unbalance converter.

FIG. 2 shows the equivalent circuit of the balance-unbalance converter 100 according to a preferred embodiment of the present invention.

The balance-unbalance converter 100 includes the unbalanced terminal (input/output terminal) 2, the first balanced terminal (input/output terminal) 3, the second balanced terminal (input/output terminal) 4, and the ground terminal 5.

A low pass filter LPF is connected between the unbalanced terminal 2 and the first balanced terminal 3. The low pass filter LPF includes a first inductor L1 and a first capacitor C1, and one end of the first capacitor C1 is connected to ground via the ground terminal 5.

A high pass filter HPF is connected between the unbalanced terminal 2 and the second balanced terminal 4. The high pass filter HPF includes a second inductor L2 and a second capacitor C2, and one end of the second inductor L2 is connected to the ground via the ground terminal 5.

The balance-unbalance converter 100 including such an equivalent circuit is able to mutually convert a balanced signal and an unbalanced signal. For example, when an unbalanced signal is inputted to the unbalanced terminal 2, balanced signals that are different in phase from each other by about 180 degrees and have amplitudes equal or substantially equal to each other are outputted to the first balanced terminal 3 and the second balanced terminal 4.

Next, the relationship between the structure and the equivalent circuit of the balance-unbalance converter 100 will be described with reference to FIGS. 1 and 2.

In the balance-unbalance converter 100, the low pass filter LPF includes the first inductor L1 and the first capacitor C1.

The first inductor L1 of the low pass filter LPF has a structure such that a helical portion in which via electrodes and line electrodes are alternately connected and a via continuous portion in which a plurality of via electrodes are connected to each other.

The helical portion of the first inductor L1 starts with the line electrode 8a. From the unbalanced terminal 2 to the line electrode 8a, which is the starting point of the helical portion, the helical portion is connected via the via electrode 6a, the via electrode 6e, the connection electrode 9a, the via electrode 6i, the capacitor electrode 7a, the via electrode 6m, the via electrode 6q, the capacitor electrode 7e, and the via electrode 6u in order.

In the helical portion of the first inductor L1, the line electrode 8a is the starting point, the via electrode 6y, the line electrode 8e, the via electrode 6ac, the line electrode 8g, the via electrode 6ag, the line electrode 8i, the via electrode 6ak, the line electrode 8k, the via electrode 6ao, the line electrode 8m, the via electrode 6as, the line electrode 8o, the via electrode 6aw, the line electrode 8q, the via electrode 6ba, the line electrode 8s, and the via electrode 6be are connected in order, and the line electrode 8u is an end point.

The line electrode 8u, which is the end point of the helical portion of the first inductor L1, is connected to the via electrode 6bh which is a starting point of the via continuous portion of the first inductor L1.

In the via continuous portion of the first inductor L1, the via electrode 6bh is the starting point, the via electrode 6bd, the via electrode 6az, the via electrode 6av, the via electrode 6ar, the via electrode 6an, the via electrode 6aj, and the via electrode 6af are connected in order, and the via electrode 6ab is an end point. The via electrode 6ab, which is the end point of the via continuous portion of the first inductor L1, is connected to the first balanced terminal 3 via the line electrode 8c, the via electrode 6w, the capacitor electrode 7f, the via electrode 6s, the via electrode 6o, the capacitor electrode 7b, the via electrode 6k, the connection electrode 9c, the via electrode 6g, and the via electrode 6c in order.

The first capacitor C1 of the low pass filter LPF includes a capacitance between the capacitor electrodes 7f and 7b and the capacitor electrode 7d. The capacitor electrode 7d is connected to the ground terminal 5 via the via electrode 6p, the via electrode 6l, the connection electrode 9d, the via electrode 6h, and the via electrode 6d in order.

In the balance-unbalance converter 100, the high pass filter HPF includes the second capacitor C2 and the second inductor L2.

The second capacitor C2 of the high pass filter HPF includes a capacitance between the capacitor electrodes 7a and 7e and the capacitor electrode 7c.

From the unbalanced terminal 2 to the capacitor electrode 7a, the via electrode 6a, the via electrode 6e, the connection electrode 9a, and the via electrode 6i are connected in order. In addition, from the capacitor electrode 7a to the capacitor electrode 7e, the via electrode 6m and the via electrode 6q are connected in order.

From the capacitor electrode 7c to the second balanced terminal 4, the via electrode 6n, the via electrode 6j, the connection electrode 9b, the via electrode 6f, and the via electrode 6b are connected in order.

The second inductor L2 of the high pass filter HPF has a structure such that a via continuous portion in which a plurality of via electrodes are connected and a helical portion in which via electrodes and line electrodes are alternately connected are connected to each other.

The via continuous portion of the second inductor L2 starts with the via electrode 6z. From the second balanced terminal 4 to the via electrode 6z, which is starting point of the via continuous portion, the via continuous portion is connected via the via electrode 6b, the via electrode 6f, the connection electrode 9b, the via electrode 6j, the via electrode 6n, the capacitor electrode 7c, the via electrode 6r, the via electrode 6v, and the line electrode 8b in order.

The via continuous portion of the second inductor L2 starts with the via electrode 6, is connected via the via electrode 6ad, the via electrode 6ah, the via electrode 6al, the via electrode 6ap, the via electrode 6at, the via electrode 6ax, and the via electrode 6bb in order, and ends with the via electrode 6bf.

The via electrode 6bf, which is the end point of the via continuous portion of the second inductor L2, is connected to the line electrode 8v which is a starting point of the helical portion of the second inductor L2.

The helical portion of the second inductor L2 starts with the line electrode 8v, is connected via the via electrode 6bg, the line electrode 8t, the via electrode 6bc, the line electrode 8r, the via electrode 6ay, the line electrode 8p, the via electrode 6au, the line electrode 8n, the via electrode 6aq, the line electrode 8l, the via electrode 6am, the line electrode 8j, the via electrode 6ai, the line electrode 8h, the via electrode 6ae, the line electrode 8f, and the via electrode 6aa in order, and ends with the line electrode 8d.

The line electrode 8d, which is the end point of the helical portion of the second inductor L2, is connected to the ground terminal 5 via the via electrode 6x, the via electrode 6t, the capacitor electrode 7d, the via electrode 6p, the via electrode 6l, the connection electrode 9d, the via electrode 6h, and the via electrode 6d in order.

The balance-unbalance converter 100 according to the present preferred embodiment having such a structure and having the equivalent circuit shown in FIG. 2 has the following features.

In the balance-unbalance converter 100, the via continuous portion of the first inductor L1 penetrates the helix of the helical portion of the second inductor L2, and the via continuous portion of the second inductor L2 penetrates the helix of the helical portion of the first inductor L1.

In the related art, since the via continuous portion of the first inductor L1 is outside the helix of the helical portion of the second inductor L2, the via continuous portion of the first inductor L1 becomes an obstacle, so that it is not possible to increase the size of the helix of the helical portion of the second inductor L2. On the other hand, in the balance-unbalance converter 100, since the via continuous portion of the first inductor L1 penetrates the helix of the helical portion of the second inductor L2, the via continuous portion of the first inductor L1 does not become an obstacle, so that it is possible to increase the size of the helix of the helical portion of the second inductor L2.

Similarly, in the related art, since the via continuous portion of the second inductor L2 is outside the helix of the helical portion of the first inductor L1, the via continuous portion of the second inductor L2 becomes an obstacle, so that it is not possible to increase the size of the helix of the helical portion of the first inductor L1. On the other hand, in the balance-unbalance converter 100, since the via continuous portion of the second inductor L2 penetrates the helix of the helical portion of the first inductor L1, the via continuous portion of the second inductor L2 does not become an obstacle, so that it is possible to increase the size of the helix of the helical portion of the first inductor L1.

As a result, in the balance-unbalance converter 100, it is possible to lengthen the first inductor L1 and the second inductor L2, without increasing the size of the multilayer body 1, to increase the inductance value of each of the first inductor L1 and the second inductor L2. In the present preferred embodiment, each of the inductance values of the first inductor L1 and the second inductor L2 is about 14 nH. Therefore, according to various preferred embodiments of the present invention, it is possible to produce a balance-unbalance converter used at a low frequency such as the 700 MHz band, without increasing the size of the multilayer body 1.

As described above, in the balance-unbalance converter 100, the via continuous portion of the first inductor L1 penetrates the helix of the helical portion of the second inductor L2, and the via continuous portion of the second inductor L2 penetrates the helix of the helical portion of the first inductor L1.

In the balance-unbalance converter 100 having this structure, magnetic coupling between the first inductor L1 and the second inductor L2 is significantly reduced or prevented.

That is, a current flows through the via continuous portion of the first inductor L1 from the upper side toward the lower side in the multilayer body 1. Meanwhile, a current flows through the helical portion of the second inductor L2 from the upper side toward the lower side in the multilayer body 1 while circling anticlockwise. As a result, a magnetic flux generated by the via continuous portion of the first inductor L1 and a magnetic flux generated by the helical portion of the second inductor L2 are constantly perpendicular to each other, and thus do not couple and also do not interfere with each other.

A current flows through the via continuous portion of the second inductor L2 from the lower side toward the upper side in the multilayer body 1. Meanwhile, a current flows through the helical portion of the first inductor L1 from the lower side toward the upper side in the multilayer body 1 while circling anticlockwise. As a result, a magnetic flux generated by the via continuous portion of the second inductor L2 and a magnetic flux generated by the helical portion of the first inductor L1 are constantly perpendicular to each other, and thus do not couple and also do not interfere with each other.

Thus, in the balance-unbalance converter 100, magnetic coupling between the first inductor L1 and the second inductor L2 is significantly reduced or prevented. Therefore, in the balance-unbalance converter 100, deterioration of characteristics caused by magnetic coupling between the first inductor L1 and the second inductor L2 is significantly reduced or prevented.

Furthermore, in the balance-unbalance converter 100, in the multilayer body 1, the first capacitor C1 of the low pass filter is disposed between the first inductor of the low pass filter LPF and the first balanced terminal 3, and the second capacitor C2 of the high pass filter HPF is disposed between the second inductor L2 of the high pass filter HPF and the second balanced terminal 4. As a result, in the balance-unbalance converter 100, since the capacitor electrodes 7b, 7d, and 7f of the first capacitor C1 are disposed so as to cover the first balanced terminal 3 when being viewed in a plane perspective from the lamination direction, it is possible to reduce or prevent magnetic coupling between the first balanced terminal 3 and the first inductor L1 with respect to a magnetic field generated by the first inductor L1 of the low pass filter LPF. Similarly, since the capacitor electrodes 7a, 7c, and 7e of the second capacitor C2 are disposed so as to cover the second balanced terminal 4 when being viewed in a plane perspective from the lamination direction, it is possible to reduce or prevent magnetic coupling between the second balanced terminal 4 and the second inductor L2 with respect to a magnetic field generated by the second inductor L2 of the high pass filter HPF.

In the balance-unbalance converter 100, in the multilayer body 1, the first inductor L1 of the low pass filter LPF and the second capacitor C2 of the high pass filter HPF are disposed adjacently in the lamination direction in which the insulating layers 1a to 1p are laminated, and the second inductor L2 of the high pass filter HPF and the first capacitor C1 of the low pass filter LPF are disposed adjacently in the lamination direction of the insulating layers 1a to 1p. As a result, in the balance-unbalance converter 100, the first inductor L1 and the first capacitor C1 of the low pass filter LPF and the second inductor L2 and the second capacitor C2 of the high pass filter HPF are very favorably disposed in the multilayer body 1, so that a wasted routing wire and addition of an insulating layer for routing the wire are not necessary. Since the wasted routing wire is not necessary, deterioration of characteristics caused by the routing wire does not occur.

In addition, since the wasted routing wire and addition of an insulating layer for routing the wire are not necessary, the size of the balance-unbalance converter 100 is not increased by the routing wire and the additional insulating layer.

The characteristics of the balance-unbalance converter 100 according to the above-described preferred embodiment were investigated.

Figure 3:
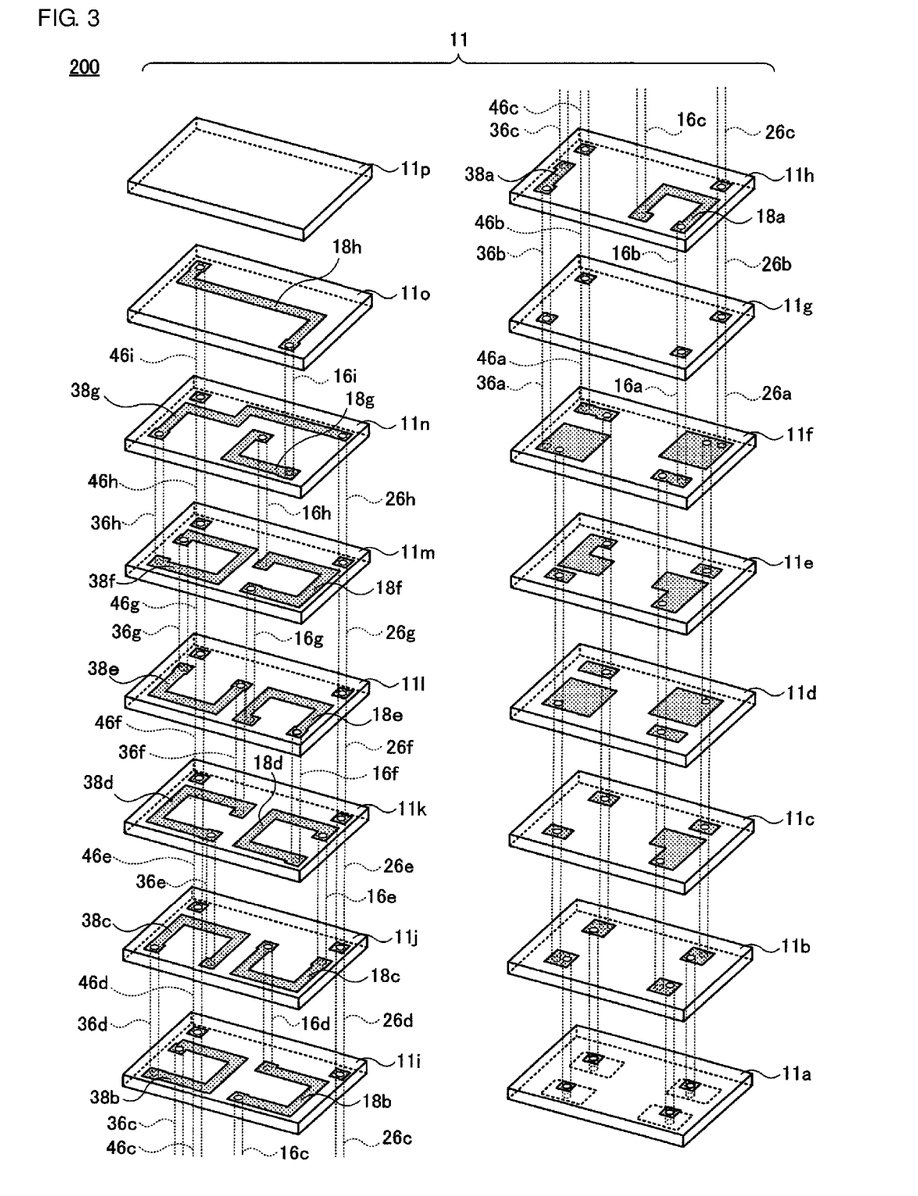
FIG. 3 is an exploded perspective view of a balance-unbalance converter according to a comparative example.

For comparison, a balance-unbalance converter 200 according to a comparative example shown in FIG. 3 was produced, and the characteristics thereof were investigated.

First, the structure of the balance-unbalance converter 200 according to the comparative example will be described. A required minimum description will be given. In addition, in FIG. 3, only components required for the description are designated by reference characters.

As shown in FIG. 3, the balance-unbalance converter 200 includes a multilayer body 11 in which 16 insulating layers 11a to 11p are laminated.

In the balance-unbalance converter 200, the via continuous portion of the second inductor L2 of the high pass filter HPF is disposed within the multilayer body 11 and outside the helical portion of the first inductor L1 of the low pass filter LPF.

That is, the via continuous portion of the second inductor L2 of the high pass filter HPF that is formed by a via electrode 26a, a via electrode 26b, a via electrode 26c, a via electrode 26d, a via electrode 26e, a via electrode 26f, a via electrode 26g, and a via electrode 26h being connected in order, is disposed outside the helical portion of the first inductor L1 of the low pass filter LPF that is formed by a via electrode 16a, a via electrode 16b, a line electrode 18a, a via electrode 16c, a line electrode 18b, a via electrode 16d, a line electrode 18c, a via electrode 16e, a line electrode 18d, a via electrode 16f, a line electrode 18e, a via electrode 16g, a line electrode 18f, a via electrode 16h, a line electrode 18g, a via electrode 16i, and a line electrode 18h being connected in order.

In the balance-unbalance converter 200, the via continuous portion of the second inductor L2 of the high pass filter HPF becomes an obstacle, so that it is not possible to increase the size of the helix of the helical portion of the first inductor L1 of the low pass filter LPF.

Similarly, in the balance-unbalance converter 200, the via continuous portion of the first inductor L1 of the low pass filter LPF is disposed within the multilayer body 11 and outside the helical portion of the second inductor L2 of the high pass filter HPF.

That is, the via continuous portion of the first inductor L1 of the low pass filter LPF that is formed by a via electrode 46a, a via electrode 46b, a via electrode 46c, a via electrode 46d, a via electrode 46e, a via electrode 46f, a via electrode 46g, a via electrode 46h, and a via electrode 46i being connected in order, is disposed outside the helical portion of the second inductor L2 of the high pass filter HPF that is formed by a via electrode 36a, a via electrode 36b, a line electrode 38a, a via electrode 36c, a line electrode 38b, a via electrode 36d, a line electrode 38c, a via electrode 36e, a line electrode 38d, a via electrode 36f, a line electrode 38e, a via electrode 36g, a line electrode 38f, a via electrode 36h, and a line electrode 38g being connected in order.

In the balance-unbalance converter 200, the via continuous portion of the first inductor L1 of the low pass filter LPF becomes an obstacle, so that it is not possible to increase the size of the helix of the helical portion of the second inductor L2 of the high pass filter HPF.

Because of the above, in the balance-unbalance converter 200 according to the comparative example, it is not possible to lengthen the first inductor L1 and the second inductor L2, and each of the inductance values of the first inductor L1 and the second inductor L2 is about 7 nH. In the balance-unbalance converter 100 according to a preferred embodiment of the present invention, as described above, each of the inductance values of the first inductor L1 and the second inductor L2 is about 14 nH, for example.

Figure 4:
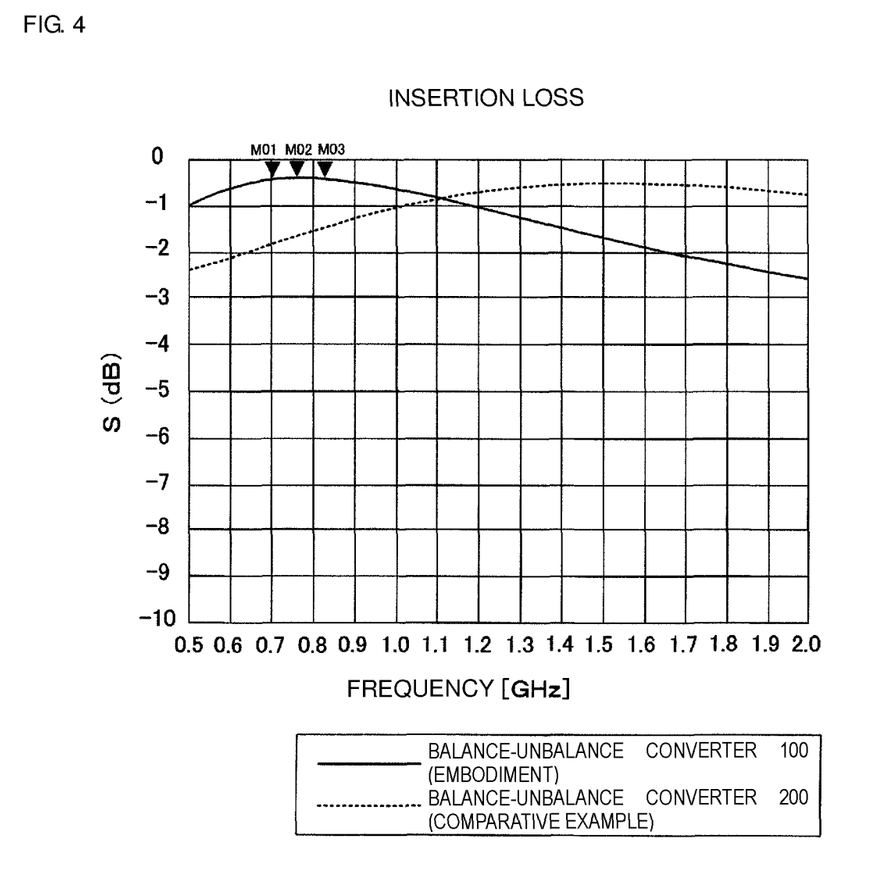
FIG. 4 is a graph showing the insertion loss of the balance-unbalance converter according to a preferred embodiment of the present invention and the insertion loss of the balance-unbalance converter according to the comparative example.

FIG. 4 shows the insertion loss of the balance-unbalance converter 100 according to the present preferred embodiment and the insertion loss of the balance-unbalance converter 200 according to the comparative example. As is seen from FIG. 4, the insertion loss of the balance-unbalance converter 100 is very low at approximately 700 MHz, for example.

Figure 5:
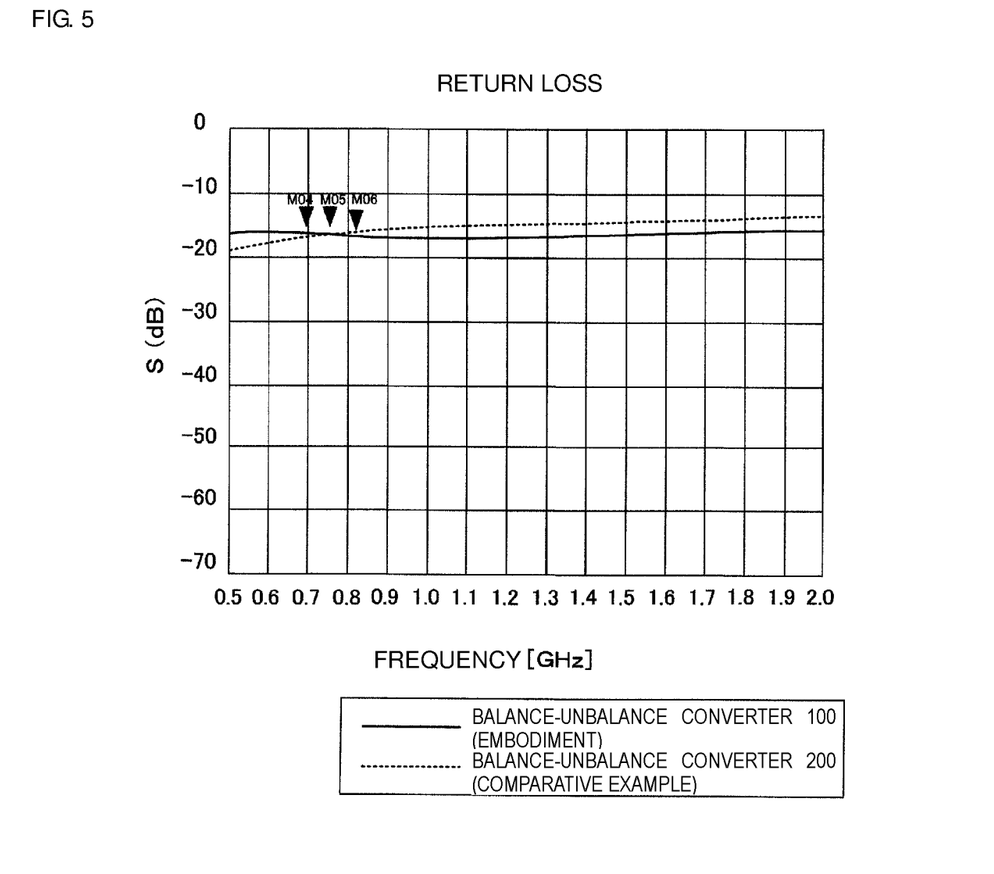
FIG. 5 is a graph showing the return loss of the balance-unbalance converter according to a preferred embodiment of the present invention and the return loss of the balance-unbalance converter according to the comparative example.

FIG. 5 shows the return loss of the balance-unbalance converter 100 according to a preferred embodiment of the present invention and the return loss of the balance-unbalance converter 200 according to the comparative example. As is seen from FIG. 5, the difference in return loss between the balance-unbalance converter 100 and the balance-unbalance converter 200 is not great at approximately 700 MHz.

Figure 6:
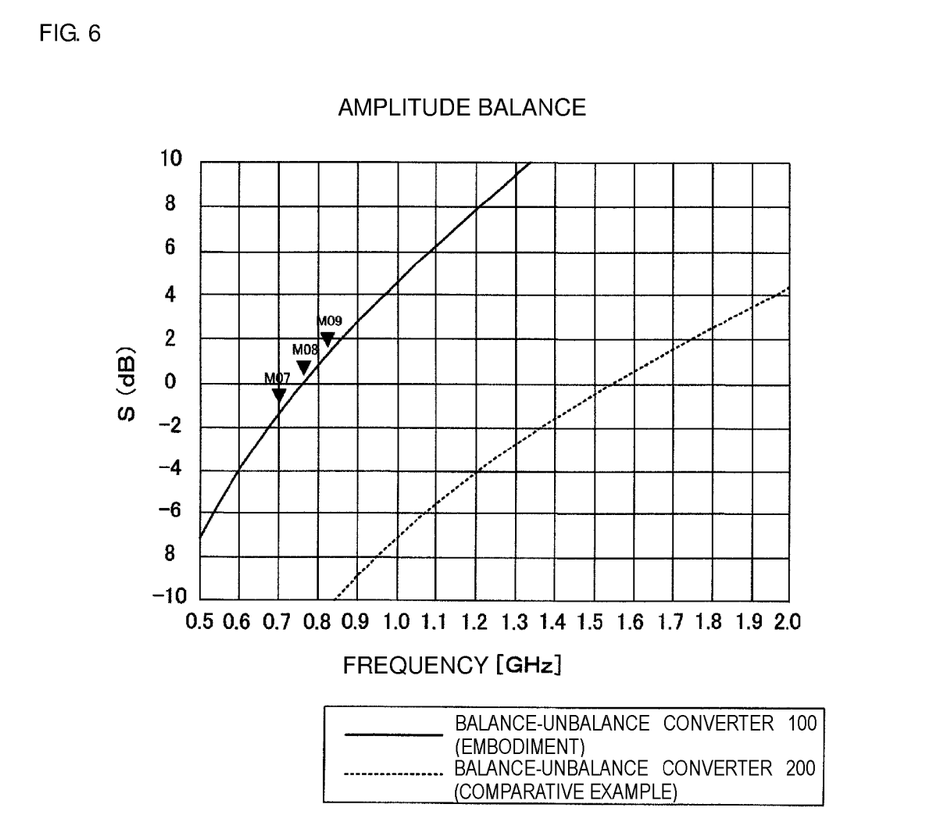
FIG. 6 is a graph showing the amplitude balance of the balance-unbalance converter according to a preferred embodiment of the present invention and the amplitude balance of the balance-unbalance converter according to the comparative example.

FIG. 6 shows the amplitude balance of the balance-unbalance converter 100 according to a preferred embodiment of the present invention and the amplitude balance of the balance-unbalance converter 200 according to the comparative example. As is seen from FIG. 6, the amplitude balance of the balance-unbalance converter 100 is 0 dB at approximately 700 MHz and is very favorable.

Figure 7:
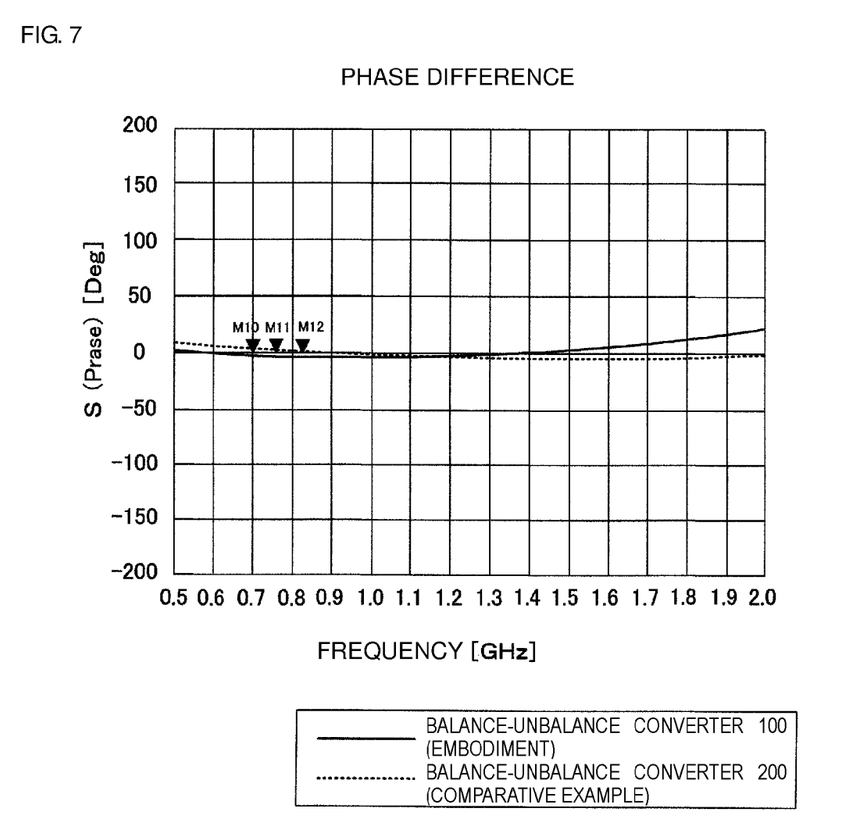
FIG. 7 is a graph showing the phase difference of the balance-unbalance converter according to a preferred embodiment of the present invention and the phase difference of the balance-unbalance converter according to the comparative example.

FIG. 7 shows the phase difference of the balance-unbalance converter 100 according to a preferred embodiment of the present invention and the phase difference of the balance-unbalance converter 200 according to the comparative example. As is seen from FIG. 7, at approximately 700 MHz, the phase difference of the balance-unbalance converter 100 is slightly better than the phase difference of the balance-unbalance converter 200.

As described above, according to various preferred embodiments of the present invention, it is possible to realize a balance-unbalance converter that has excellent characteristics and is used at a low frequency such as the 700 MHz band, without increasing the shape.

The balance-unbalance converter 100 according to preferred embodiments of the present invention has been described above. However, the present invention is not limited to the above preferred embodiments, and various modifications can be made according to the gist of the present invention.

For example, in the balance-unbalance converter 100, the multilayer body 1 includes the 16 insulating layers 1a to 1p, but the number of the insulating layers is optional and may be increased or decreased.

The magnitudes of the diameters of the via electrodes 6a to 6bh are also optional, and the diameters of the via electrodes 6a to 6bh may be increased from those shown in FIG. 1 to improve Q of the inductor or the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A balance-unbalance converter comprising:
a multilayer body including a plurality of insulating layers laminated in a lamination direction;
an unbalanced terminal, a first balanced terminal, and a second balanced terminal on a surface of the multilayer body;
a capacitor electrode between predetermined ones of the plurality of insulating layers of the multilayer body;
a line electrode between predetermined ones of the plurality of insulating layers of the multilayer body;
a via electrode that penetrates between both principal surfaces of a predetermined one of the insulating layers;
a low pass filter connected between the unbalanced terminal and the first balanced terminal and including a first inductor and a first capacitor; and
a high pass filter connected between the unbalanced terminal and the second balanced terminal and including a second inductor and a second capacitor; wherein
the first inductor of the low pass filter has a structure such that a helical portion in which the via electrode and the line electrode are alternately connected and a via continuous portion in which a plurality of the via electrodes are connected to each other;
the first capacitor of the low pass filter includes a plurality of the opposing capacitor electrodes;
the second inductor of the high pass filter has a structure such that a helical portion in which the via electrode and the line electrode are alternately connected and a via continuous portion in which a plurality of the via electrodes are connected to each other;
the second capacitor of the high pass filter includes a plurality of the opposing capacitor electrodes;
the via continuous portion of the first inductor penetrates a helix of the helical portion of the second inductor; and
the via continuous portion of the second inductor penetrates a helix of the helical portion of the first inductor.

2. The balance-unbalance converter according to claim 1, wherein
the via continuous portion of the first inductor penetrates a center or an approximate center within the helix of the helical portion of the second inductor; and
the via continuous portion of the second inductor penetrates a center or an approximate center within the helix of the helical portion of the first inductor.

3. The balance-unbalance converter according to claim 1, wherein, in the multilayer body, the first capacitor of the low pass filter and the second capacitor of the high pass filter are disposed between the first inductor of the low pass filter and the second inductor of the high pass filter and the first balanced terminal and the second balanced terminal.

4. The balance-unbalance converter according to claim 3, wherein, in the multilayer body:
the first inductor of the low pass filter and the second capacitor of the high pass filter are disposed adjacently in the lamination direction; and
the second inductor of the high pass filter and the first capacitor of the low pass filter are disposed adjacently in the lamination direction in which the insulating layers are laminated.

5. The balance-unbalance converter according to claim 1, wherein each of the unbalanced terminal, the first balanced terminal, and the second balanced terminal includes a metal layer and a plating layer.

6. The balance-unbalance converter according to claim 1, wherein the multilayer body includes a plurality of via electrodes connecting conductive elements.

7. The balance-unbalance converter according to claim 1, wherein the line electrode is annular or substantially annular.

8. The balance-unbalance converter according to claim 6, wherein a plurality of auxiliary electrodes are provided at ends of respective ones of the plurality of via electrodes.

9. The balance-unbalance converter according to claim 1, wherein one of the plurality of insulating layers does not contain a conductive material thereon and defines a protective layer.

10. The balance-unbalance converter according to claim 1, wherein the first capacitor of the low pass filter is connected to a ground terminal.

11. The balance-unbalance converter according to claim 1, wherein the second inductor of the high pass filter is connected to a ground terminal.

12. The balance-unbalance converter according to claim 1, wherein the first capacitor of the low pass filter is between the first inductor of the low pass filter and the first balanced terminal.

13. The balance-unbalance converter according to claim 1, wherein the second capacitor of the high pass filter is between the second inductor of the high pass filter and the second balanced terminal.

14. The balance-unbalance converter according to claim 1, wherein capacitor electrodes of the first capacitor cover the first balanced terminal in a planar view in the lamination direction.

15. The balance-unbalance converter according to claim 1, wherein capacitor electrodes of the second capacitor cover the second balanced terminal in a planar view in the lamination direction.

* * * * *